United States Patent
Chen et al.

(10) Patent No.: US 9,443,616 B2
(45) Date of Patent: Sep. 13, 2016

(54) BAD MEMORY UNIT DETECTION IN A SOLID STATE DRIVE

(71) Applicant: Seagate Technology LLC, Cupertino, CA (US)

(72) Inventors: Zhengang Chen, San Jose, CA (US); Earl T. Cohen, Cupertino, CA (US); Erich F. Haratsch, San Jose, CA (US); Jeremy Werner, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 26 days.

(21) Appl. No.: 14/263,189

(22) Filed: Apr. 28, 2014

(65) Prior Publication Data

US 2015/0287478 A1    Oct. 8, 2015

Related U.S. Application Data

(60) Provisional application No. 61/974,078, filed on Apr. 2, 2014.

(51) Int. Cl.

| | |
|---|---|
| *G11C 29/44* | (2006.01) |
| *G11C 29/26* | (2006.01) |
| G11C 29/38 | (2006.01) |
| G11C 29/00 | (2006.01) |
| G11C 29/04 | (2006.01) |
| G06F 11/07 | (2006.01) |
| G11C 29/42 | (2006.01) |
| G11C 29/52 | (2006.01) |
| G11C 16/34 | (2006.01) |

(52) U.S. Cl.
CPC ............... *G11C 29/44* (2013.01); *G11C 29/26* (2013.01); *G06F 11/07* (2013.01); *G06F 11/073* (2013.01); *G06F 11/0727* (2013.01); *G11C 16/349* (2013.01); *G11C 29/38* (2013.01); *G11C 29/42* (2013.01); *G11C 29/52* (2013.01); *G11C 29/765* (2013.01); *G11C 2029/0403* (2013.01); *G11C 2029/0409* (2013.01)

(58) Field of Classification Search
CPC ....... G11C 29/38; G11C 29/44; G11C 29/42; G11C 29/52; G11C 29/765; G11C 2029/0403; G11C 16/349; G11C 29/26; G11C 9/44; G11C 2029/0409; G06F 11/07; G06F 11/0727; G06F 11/073
See application file for complete search history.

(56) References Cited

U.S. PATENT DOCUMENTS

| | | | | |
|---|---|---|---|---|
| 7,765,426 B2 * | 7/2010 | Li | ................................ | 714/6.13 |
| 7,949,911 B2 * | 5/2011 | Tseng | ............................ | 714/720 |
| 8,225,006 B1 * | 7/2012 | Karamcheti | ............ | G06F 11/20 |
| | | | | 710/5 |
| 8,489,942 B1 | 7/2013 | Wong et al. | ................... | 714/710 |
| 8,572,466 B2 | 10/2013 | Bueb et al. | .................... | 714/774 |

(Continued)

*Primary Examiner* — Cynthia Britt
*Assistant Examiner* — Sazzad Hossain
(74) *Attorney, Agent, or Firm* — Christopher P. Maiorana, PC

(57) ABSTRACT

An apparatus comprising a memory and a controller. The memory is configured to process a plurality of read/write operations. The memory comprises a plurality of memory unit granularities each having a size less than a total size of the memory. The controller is configured to process a plurality of I/O requests to the memory units of the memory that are not marked as bad on a memory unit list. The controller is configured to track a plurality of bad blocks of the memory. The controller is configured to determine which of the memory units to mark as bad based on a test of whether a unit of memory larger than a block of the memory has failed. The test is based on a threshold of the bad blocks in the unit of memory.

20 Claims, 7 Drawing Sheets

(56) References Cited

U.S. PATENT DOCUMENTS

| | | | | |
|---|---|---|---|---|
| 8,595,601 B2 | 11/2013 | Kim et al. | | 714/780 |
| 8,631,274 B2 | 1/2014 | Frost et al. | | 714/6.24 |
| 8,700,961 B2* | 4/2014 | Lassa | | G11C 29/883 714/710 |
| 2005/0283707 A1* | 12/2005 | Sharon | | H03M 13/1137 714/758 |
| 2007/0121396 A1* | 5/2007 | Nitzan | | G11C 29/846 365/200 |
| 2008/0077825 A1* | 3/2008 | Bello | | G06F 11/0727 714/54 |
| 2008/0209294 A1* | 8/2008 | Brink | | G11C 29/12 714/735 |
| 2010/0228940 A1* | 9/2010 | Asnaashari | | G06F 12/0246 711/170 |
| 2011/0087950 A1* | 4/2011 | Yu | | G06F 11/1072 714/773 |
| 2012/0124436 A1* | 5/2012 | Okahiro | | G11C 29/40 714/726 |
| 2012/0144095 A1* | 6/2012 | Han | | G06F 12/0246 711/103 |
| 2012/0254680 A1 | 10/2012 | Oh et al. | | 714/723 |
| 2013/0173972 A1* | 7/2013 | Kubo | | G11C 16/00 714/718 |
| 2013/0336059 A1 | 12/2013 | Lee et al. | | 365/185.09 |
| 2014/0006847 A1 | 1/2014 | Guo et al. | | 714/6.1 |
| 2014/0047283 A1 | 2/2014 | Bueb et al. | | 714/48 |
| 2014/0082458 A1 | 3/2014 | Kim et al. | | 714/764 |
| 2014/0237298 A1* | 8/2014 | Pe'er | | G11C 16/3418 714/42 |
| 2014/0281152 A1* | 9/2014 | Karamcheti | | G06F 12/0246 711/103 |
| 2014/0289559 A1* | 9/2014 | Hashimoto | | G11C 29/08 714/27 |
| 2015/0026528 A1* | 1/2015 | d'Abreu | | G11C 29/56012 714/718 |

* cited by examiner

BAD MEMORY UNIT DETECTION IN A SOLID STATE DRIVE

This application relates to U.S. Provisional Application No. 61/974,078, filed Apr. 2, 2014, which is hereby incorporated by reference in its entirety.

FIELD OF THE INVENTION

The invention relates to data storage generally and, more particularly, to a method and/or apparatus for implementing bad memory unit detection in a solid state drive.

BACKGROUND

A solid-state drive (SSD) is composed of the storage media, the controller and other peripheral components. The storage media used in SSDs is NAND flash memory. A flash memory die or plane may have failures due to various causes such as manufacturing defects, voltage pump failure, or some short in the NAND circuitry. Overall the failure rate of a flash memory die/plane is very low, in the order of parts per million. However, the damaging effect of die/plane failures is significant for a SSD because the capacity lost, the potential data loss, and/or the functionality loss is large. Assuming one plane contains 1024 blocks and each block has a capacity of 4M bytes, a plane failure leads to a 4 GB capacity loss. A dual-plane die failure leads to an 8 GB capacity loss. In a low-end SSD with 100 GB user capacity, such capacity loss nearly renders the drive defective. As memory density increases the potential loss of capacity due to a die/plane failure also increases. In an enterprise SSD, such capacity loss leads to less over-provisioning, which has a negative impact on performance. Without any dedicated die failure detection or handling algorithms, a die failure can be treated as multiple block failures. A SSD would have to rely on bad block detection and handling. A SSD may take a long time to detect and handle bad blocks in the failed die/plane individually.

It would be desirable to implement a die failure, plane failure and/or memory unit failure detection in a SSD controller and/or a drive.

SUMMARY

The invention concerns an apparatus comprising a memory and a controller. The memory is configured to process a plurality of read/write operations. The memory comprises a plurality of memory unit granularities each having a size less than a total size of the memory. The controller is configured to process a plurality of I/O requests to the memory units of the memory that are not marked as bad on a memory unit list. The controller is configured to track a plurality of bad blocks of the memory. The controller is configured to determine which of the memory units to mark as bad based on a test of whether a unit of memory larger than a block of the memory has failed. The test is based on a threshold of the bad blocks in the unit of memory.

BRIEF DESCRIPTION OF THE FIGURES

Embodiments of the invention will be apparent from the following detailed description and the appended claims and drawings in which:

DETAILED DESCRIPTION OF THE EMBODIMENTS

Figure 1:
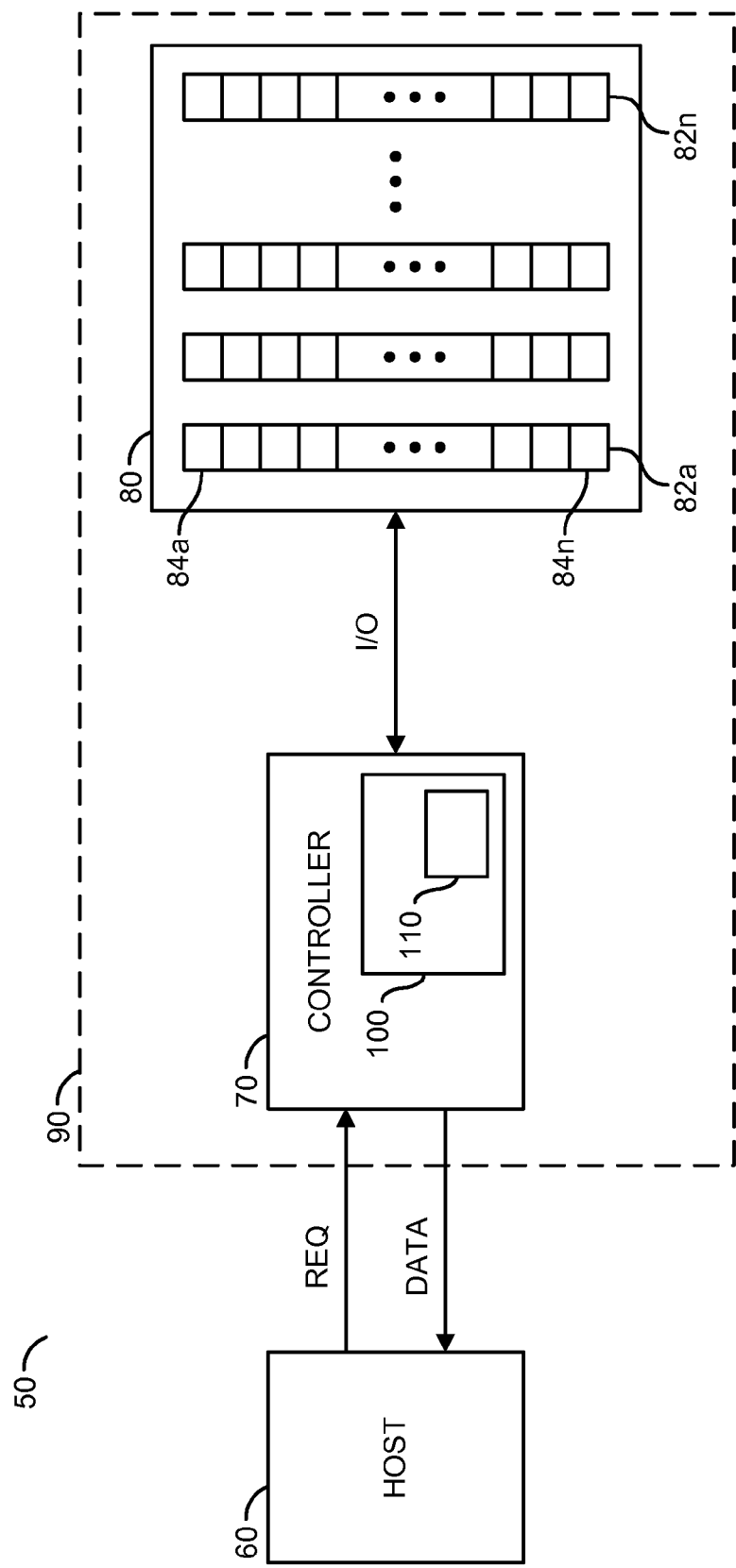
FIG. 1 is a diagram illustrating an example embodiment.

Embodiments of the invention include providing bad memory unit detection in solid state drives that may (i) implement detection of bad memory units at a memory die and/or memory plane granularity, (ii) be performed during the run-time and/or the manufacturing time of a drive, (iii) be embedded in a manufacturer self-test of the drive, (iv) not use memory units that are marked as bad, (v) be triggered after detecting a bad memory block, (vi) track bad blocks based on program/erase failures and read failures separately, (vii) modify failure thresholds for determining memory unit failure, (viii) pro-actively take measures based on memory unit failure, (ix) be easy to implement, (x) be implemented as one or more integrated circuits, (xi) be implemented as a memory/processor configured to store computer instructions (or firmware) to be run in an integrated circuit, (xii) be implemented as processor executable instructions to be run through information passed up to a host.

In a SSD, a memory die or memory plane failure may cause a number of problems. Problems may be avoided and/or mitigated by detecting bad memory dies and/or memory planes. Detection of bad memory dies and/or bad memory planes may be detected during a manufacturing time (e.g., during a manufacturer self-test) and/or throughout the life of the drive (e.g., during the run-time of the drive).

Memory dies and/or memory planes may fail during manufacturing time. For example, a memory plane/die may be detected before the memory is shipped. Memory dies and/or memory planes may also fail during the lifetime of a SSD.

In a SSD controller that is not configured to implement dedicated memory die/plane failure detection and/or handling, a memory die/plane failure may be treated as multiple memory block failures. A SSD may rely on bad block detection and/or handling. Implementing memory die/plane failure detection and/or management in the SSD controller provides advantages over relying on bad block detection and/or handling. For example, a memory die/plane may be comprised of a large number of memory blocks. A SSD controller relying on bad block handling and/or detection may take a long time to detect and/or handle bad memory blocks in a failed memory die/plane individually.

For example, early detection of a bad memory die/plane may allow the controller to pro-actively take measures in response to a bad memory die/plane. For example, data may be moved to a reliable storage location. In another example, the host may be informed of memory die/plane failure. Memory die/plane failure detection may avoid having a burst of memory block failures. A burst of memory block failures may severely impact performance of the SSD and/or brick the drive (e.g., render the drive unusable) if over-provisioning space is lost. In another example, a SSD implementing a block recovery method (e.g., parity striping across a memory die) without the capability of bad memory die/plane detection may have to rely on recovering data block by block when a failure is detected. Generally, recovering data block by block may cause ongoing performance and/or reliability issues. A SSD controller implementing early detection of memory die/plane failure may take controlled measures to recover the stored data and/or pro-actively re-map bad blocks.

Generally, in SSDs used in enterprise applications, a redundant array of silicon independent elements (RASIE) may be used to protect the data from memory block failures. Generally, a RASIE stripe may be comprised of memory blocks from different memory dies/planes. For example, 1 to 2 memory blocks may store redundant parity bits (e.g., R-blocks), depending on the RASIE protection level. In the event of a block failure, RASIE protection is lost and/or weakened for the associated R-block. When a R-block fails, data from the affected R-block may need to be rebuilt. For example, early detection of bad memory dies/planes may help the controller initiate optimized routines in rebuilding data on thousands of R-blocks. In another example without dedicated memory die/plane failure detection and/or handling, the controller may need to wait for individual memory block failure events to trigger recovery/recycling of each R-block associated with the bad memory die/plane.

Waiting for individual memory block failures to trigger recovery/recycling may lead to decreased performance of the drive. For example, additional errors may occur in a R-block between the time that a die failure occurs and the time that block failure is recognized without a pro-active approach (e.g., relying on bad block detection and handling). The additional errors may overwhelm the RASIE stripe protection, which may cause data loss. A pro-active approach to memory die/plane failure and/or detection may contain errors and/or prevent additional errors from overwhelming the RASIE stripe protection.

Referring to FIG. 1, a block diagram of an example apparatus 50 is shown. The apparatus 50 generally comprises a block (or circuit) 60, a block (or circuit) 70 and a block (or circuit) 80. The circuit 70 may include a circuit 100. The circuit 100 may be a memory/processor configured to store computer instructions (or firmware) or may be logic. The instructions, when executed, may perform a number of steps. The firmware 100 may include a redundancy control module 110. The redundancy control module 110 may be implemented as part of the firmware 100 or as a separate module. While an example of redundancy implemented in the firmware 100 is shown, the redundancy may be implemented, in another example, in hardware (e.g., logic such as a state machine).

A signal (e.g., REQ) may be generated by the circuit 60. The signal REQ may be received by the circuit 70. The signal REQ may be a request signal that may be used to access data from the circuit 80. A signal (e.g., I/O) may be generated by the circuit 70 to be presented to/from the circuit 80. The signal REQ may include one or more address bits. A signal (e.g., DATA) may be one or more data portions received by the circuit 60.

The circuit 60 is shown implemented as a host circuit. The circuit 70 reads and writes data to and from the circuit 80. The circuit 80 is generally implemented as a nonvolatile memory circuit. The circuit 80 may include a number of modules 82a-82n. The modules 82a-82n may be implemented as NAND flash chips. In some embodiments, the circuit 80 may be a NAND flash device. In other embodiments, the circuit 70 and/or the circuit 80 may be implemented as all or a portion of a solid state drive 90 having one or more nonvolatile devices. The circuit 80 is generally operational to store data in a nonvolatile condition. When data is read from the circuit 80, the circuit 70 may access a set of data (e.g., multiple bits) identified in the signal REQ. The signal REQ may request data from the drive 90 or from one of a number of additional storage devices.

Data within the circuit 80 is generally organized in a hierarchy of units (e.g., memory units), such as die, plane, block, and/or page units. The circuit 80 may contain multiple dies (e.g., in a single package or multiple packages). Generally, for enterprise applications the circuit 80 may be comprised of hundreds of flash memory dies. Flash memory may have multiple planes in the same die. The planes may be accessed in parallel to improve performance.

A first type of redundancy may be implemented as a redundancy block. A redundancy block is a combination of blocks (e.g., a block from each nonvolatile memory die in the circuit 80) that can be combined to form a redundant array of silicon independent elements, similar to a redundant array of independent disks for magnetic media. The nonvolatile memory locations within the blocks may be written in a striped fashion. In some embodiments, organizing a plurality of blocks in redundancy blocks reduces an overhead of block management. A block is generally considered a smallest quantum of erasing. A page is generally considered a smallest quantum of writing. A read unit (or codeword or Epage or ECC-page) is a smallest correctable quantum of reading and/or error correction. Each block includes an integer number of pages. Each page includes an integer number of read units.

In some embodiments, the circuit 80 may be implemented as a single-level cell (e.g., SLC) type circuit. An SLC type circuit generally stores a single bit per memory cell (e.g., a logical 0 or 1). In other embodiments, the circuit 80 may be implemented as a multi-level cell (e.g., MLC) type circuit. An MLC type circuit is generally capable of storing multiple (e.g., two) bits per memory cell (e.g., logical 00, 01, 10 or 11). In still other embodiments, the circuit 80 may implement a triple-level cell (e.g., TLC) type circuit. A TLC circuit may be able to store multiple (e.g., three) bits per memory cell (e.g., a logical 000, 001, 010, 011, 100, 101, 110 or 111). In yet another embodiment, the circuit 80 may implement a circuit with a cell level greater than a triple-level cell. Generally, the circuit 80 may be implemented as a n-level cell capable of storing n-bits per memory cell.

In general, the controller 70 may include an erase/program unit that may implement redundancy across the modules 82a-82n. For example, multiple blocks may be read from multiple dies 82a-82n. The erase/program unit may be implemented as part of the firmware (or logic) 100.

The drive 90 may contain, in one example, multiple NAND Flash or memory modules 82a-82n. Each of the memory modules may be fabricated as one or more dies (e.g., 1, 2, 4, 8, etc.). The dies (or modules) 82a-82n may operate to read or to write concurrently. The read and write bandwidth depends on how many of the dies 82a-82n are implemented, as well as the bandwidth of each of the dies 82a-82n. Each of the dies 82a-82n may contain a plurality of planes. Each of the planes of the dies 82a-82n may contain a plurality of blocks 84a-84n. The blocks 84a-84n of the planes of one of the dies 82a-82n may be accessed in parallel. If the SSD 90 receives the host command REQ, in order to achieve the best performance, and/or to address wear leveling issues, the drive 90 will walk through all of the dies 82a-82n (e.g., a first page of DIE0, DIE1 ... DIEn, then a next page of DIE0).

Figure 2:
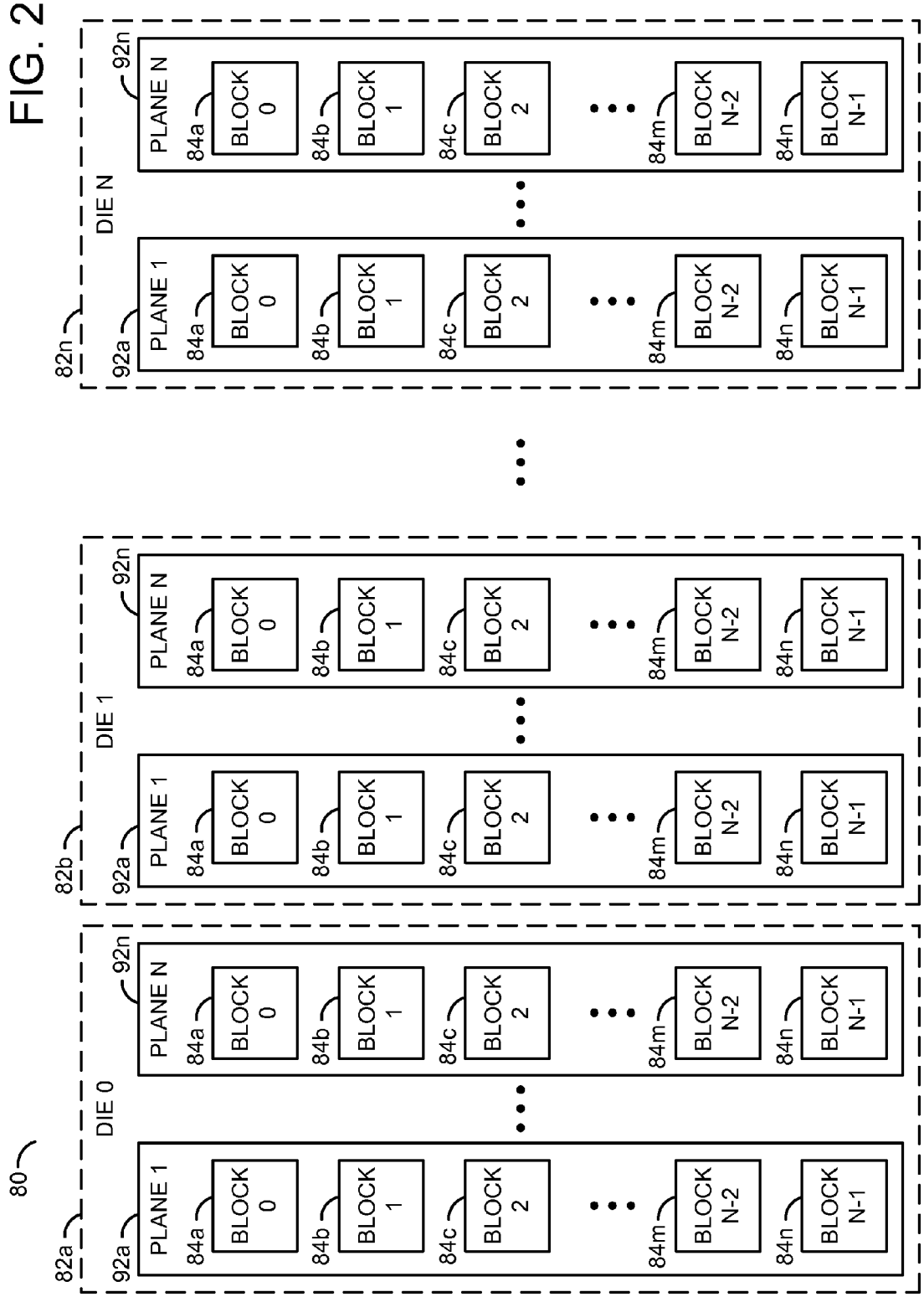
FIG. 2 is a diagram illustrating an example of a memory unit hierarchy.

Referring to FIG. 2, a block diagram illustrating an example of a hierarchy of memory units of the memory circuit 80 is shown in accordance with an embodiment of the invention. The memory circuit 80 generally comprises the die modules 82a-82n, the memory blocks 84a-84n, and the blocks (or circuits) 92a-92n. Each of the die modules 82a-82n generally comprise the circuits 92a-92n. The circuits 92a-92n may be memory planes of the die modules 82a-82n. Each of the memory planes 92a-92n generally comprise the memory blocks 84a-84n.

A die module (e.g., one of the die modules 82a-82n) may be divided into the multiple memory planes 92a-92n. The number of memory planes 92a-92n may be varied to meet the design criteria of a particular implementation. Generally, there may be 2-4 memory planes in each of the die modules 82a-82n. Each of the memory planes 92a-92n may contain the memory blocks 84a-84n.

Generally, the flash memory circuit 80 may be organized as a hierarchy of memory units. The memory units may include a granularity of a die, plane, block, page, and/or read units. The drive 90 may contain multiple memory dies 82a-82n (e.g., in a single package or multiple packages). In one example, a high-end SSD used for enterprise applications may be implemented using hundreds of the flash memory dies 82a-82n. Generally, the flash memory circuit 80 may be implemented with multiple memory planes 92a-92n in the same memory die (e.g., each of the memory dies 82a-82n may be comprised of the memory planes 92a-92n). The memory planes 92a-92n in each of the memory dies 82a-82n may be accessed in parallel to boost performance of the drive 90. In one example, each of the memory blocks 84c of the memory planes 92a-92n in the memory die 82a may be accessed in parallel (e.g., accessed as a multi-plane block).

Generally, the controller 70 in the SSD 90 is configured to detect memory blocks that are considered bad and to mark the bad memory blocks on a bad block list. The controller 70 may manage memory blocks marked as bad. For example, a memory block that is detected and/or determined to be bad may be retired (e.g., the memory block is not used to store data).

Generally, when there is a memory die failure, the memory die failure may affect all the memory blocks in the memory die (e.g., each of the memory blocks 84a-84n in the memory die 82a). For example, failures that only affect individual memory blocks and/or a portion of the memory blocks in a memory die/plane may be handled by bad block detection and handling in the controller 70. Bad memory die/plane detection may be based on memory block failure statistics within a memory die/plane (e.g., statistics for each of the memory dies 82a-82n). A memory unit failure test may check whether memory block failure events should be categorized as a memory die/plane failure. A memory unit failure test may be implemented when a memory page, block, plane, and/or die recovery error correction capability is also implemented.

Figure 3:
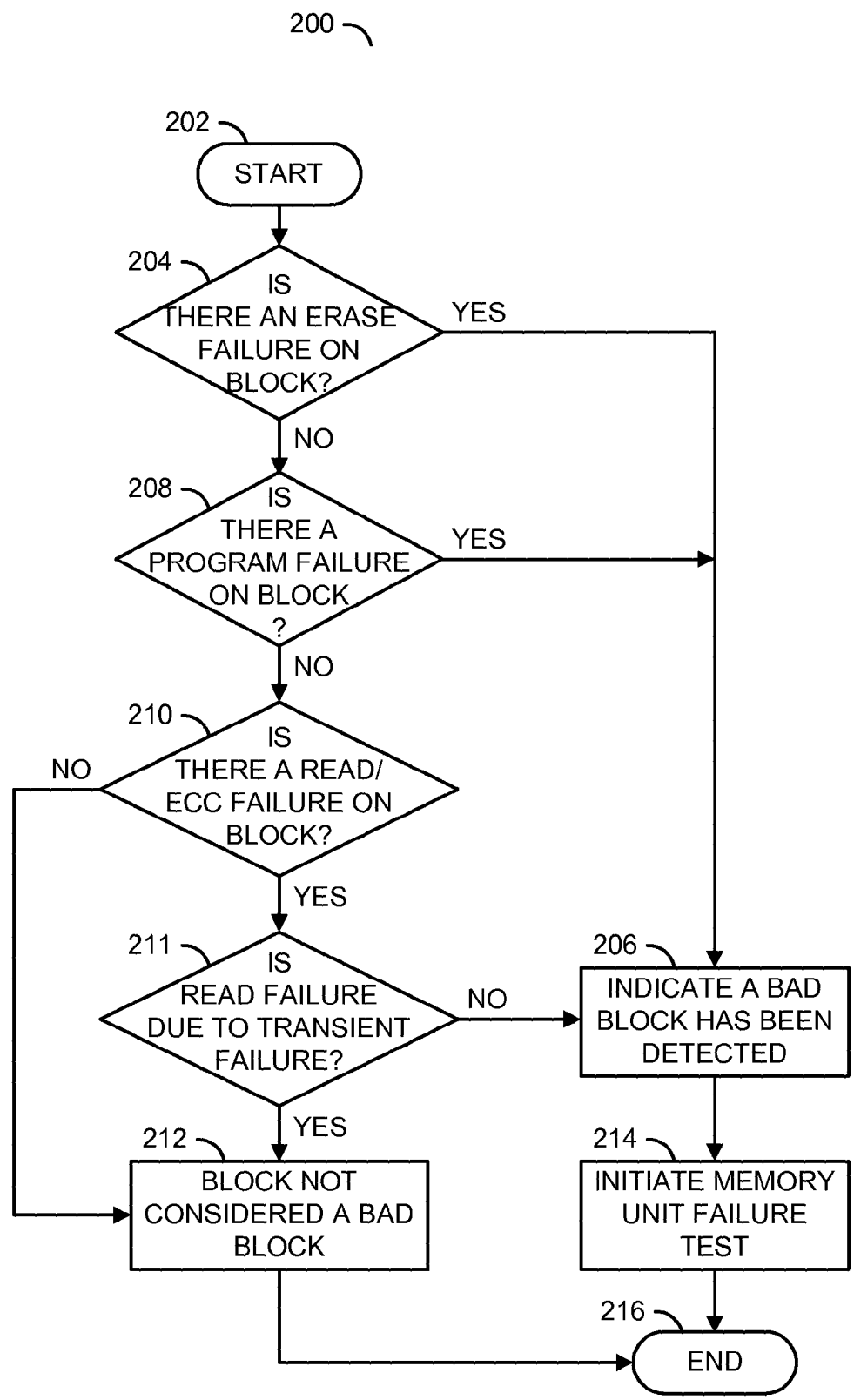
FIG. 3 is a flow diagram illustrating bad block detection criteria.

Referring to FIG. 3, a flow diagram of a method (or process) 200 is shown. The method 200 may implement a bad block detection criteria. The method 200 generally comprises a step (or state) 202, a decision step (or state) 204, a step (or state) 206, a decision step (or state) 208, a decision step (or state) 210, a decision step (or state) 211, a step (or state) 212, a step (or state) 214, and a step (or state) 216. The state 202 may start the method 200. Next, the method 200 may move to the decision state 204.

If the decision state 204 determines there is an erase failure on the block (e.g., on one of the blocks 84a-84n), the method 200 may move to the state 206. The state 206 may indicate a bad block has been detected (e.g., mark the block as bad on the bad block list). Next, the state 214 may initiate a memory unit failure test. Next, the method 200 moves to the state 216, which ends the method 200. If the decision state 204 determines there is not an erase failure on the block, the method 200 moves to the decision state 208.

If the decision state 208 determines there is a program failure on the block, the method 200 moves to the state 206. If not, the method 200 moves to the decision state 210. Generally, without adaptive code rate management, the error-correction code (ECC) scheme may be fixed. The decision state 210 determines if there is a read and/or ECC failure on the block. If so, the method 200 moves to the decision state 211. In not, the method 200 moves to the state 212.

If the decision state 211 determines the read failure is due to a transient failure, the method 200 moves to the state 212. A transient error may be read disturb errors, cell-to-cell program interference errors, and/or retention errors. The state 212 considers the block not a bad block. Additional actions may be performed on a block that is not considered a bad block. For example, the controller 70 may recover the block, and/or recycle the block. Next, the method 200 moves to the state 216, which ends the method 200. If the decision state 211 determines the read failure is not due to a transient failure, the method 200 moves to the state 206. The sequence of the steps shown is an example. Other step orders may be implemented to meet the design criteria of a particular implementation.

Figure 4:
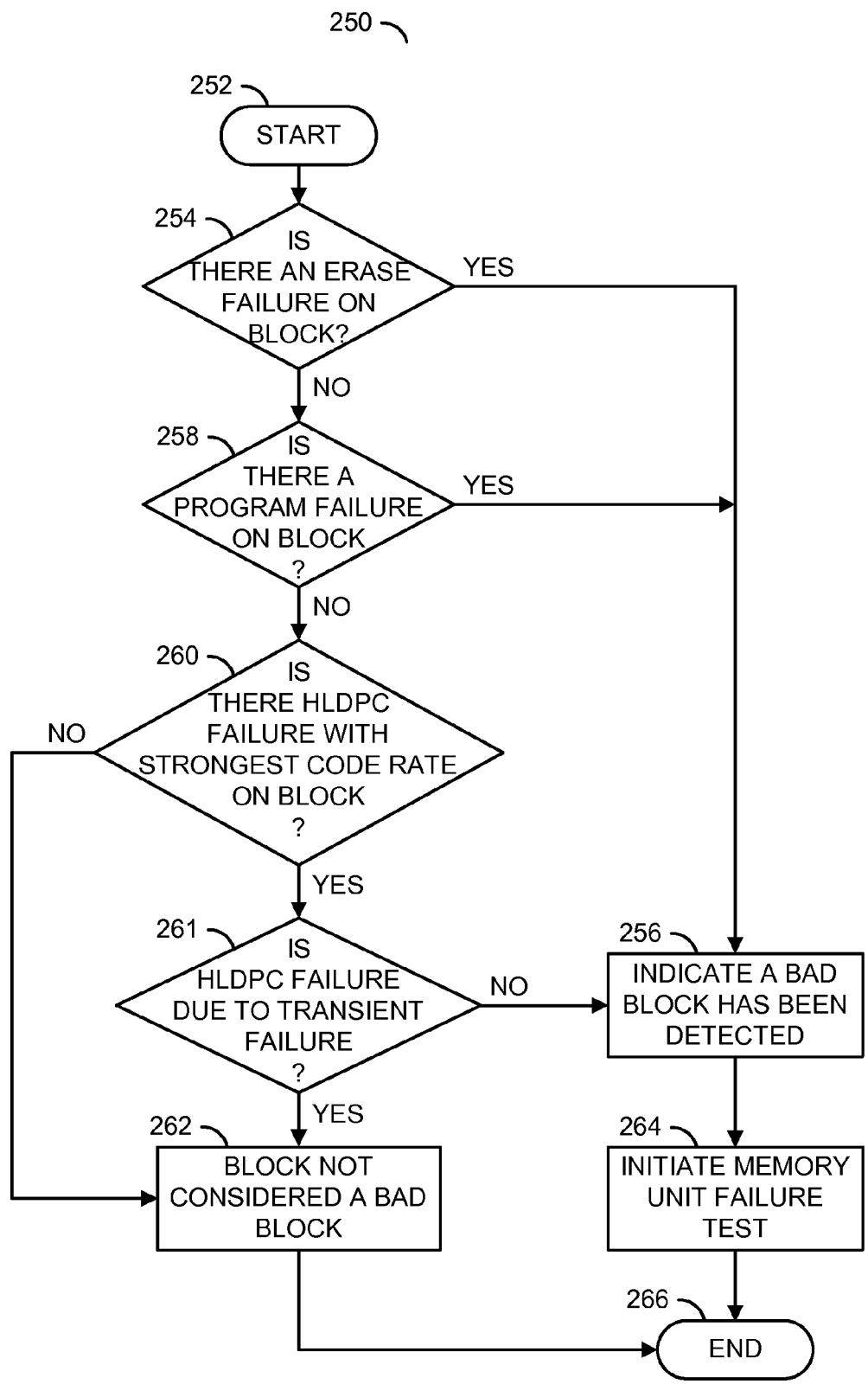
FIG. 4 is a flow diagram illustrating an example of bad block detection criteria with HLDPC.

Referring to FIG. 4, a flow diagram of a method (or process) 250 is shown. The method 250 may implement an example of bad block detection criteria with hard-decision low-density parity check (HLDPC). The method 250 generally comprises a step (or state) 252, a decision step (or state) 254, a step (or state) 256, a decision step (or state) 258, a decision step (or state) 260, a decision step (or state) 261, a step (or state) 262, a step (or state) 264, and a step (or state) 266. The state 252 may start the method 250. Next, the method 250 may move to the decision state 254. If the decision state 254 determines there is an erase failure on the block (e.g., on one of the blocks 84a-84n), the method 250 may move to the state 256. The state 256 may indicate a bad block has been detected (e.g., mark the block as bad on the bad block list). Next, the state 264 may initiate a memory unit failure test. Next, the method 250 moves to the state 266, which ends the method 250.

If the decision state 254 determines there is not an erase failure on the block, the method 250 moves to the decision state 258. If the decision state 258 determines there is a program failure on the block, the method 250 moves to the state 256. If not, the method 250 moves to the decision state 260. If the decision state 260 determines there is an HLDPC failure with the strongest code rate on the block, the method 250 moves to the decision state 261. If not, the method 250 moves to the state 262.

If the decision state 261 determines the HLDPC failure is due to a transient failure, the method 250 moves to the state 262. A transient error may be read disturb errors, cell-to-cell program interference errors, and/or retention errors. The state 262 considers the block not a bad block. Additional actions may be performed on a block that is not considered a bad block. For example, the controller 70 may recover the block, and/or recycle the block. Next, the method 250 moves to the state 266, which ends the method 200. If the decision state 261 determines the HLDPC failure is not due to a transient failure, the method 250 moves to the state 256.

The sequence of the steps shown is an example. Other step orders may be implemented to meet the design criteria of a particular implementation. Other types of error checks may be implemented to meet the design criteria of a particular implementation. For example, a soft-decision LDPC check may be used. In another example, the number of iterations to convergence may be an element of an error check. In yet another example, the number of bit errors may be an element of an error check.

The memory blocks 84a-84n may be marked as bad when there is a program failure, an erase failure, and/or a read failure. For example, when one of the memory blocks 84a-84n is detected as bad based on a program/erase failure, the memory block should be retired by the controller 70. Read failure may refer to read operations in the memory blocks 84a-84n that indicate the memory block does not satisfy certain reliability criteria. For example, the reliability criteria may be related to ECC decoding. In one example, if the average and/or maximum number of errors per page exceeds a threshold in one of the memory blocks 84a-84n, a read failure may be declared on the memory block. In another example, if low-density parity-check (LDPC) is used as ECC a HLDPC decoding failure event may be used as a read failure criterion. In yet another example, the average number of iterations in decoding the pages may be used as a read failure criterion. In still another example when the controller 70 implements adaptive ECC code rates, the read failure criteria in detecting a bad memory block is generally associated with the strongest (e.g., the lowest) code rate. The controller 70 may determine which of the memory blocks 84a-84n is bad if a read failure is encountered.

Other memory block failure criteria may be used. The memory block failure criteria may be varied to meet the design criteria of a particular implementation. The memory unit failure test (to be described in FIG. 5) may be implemented with other bad memory block failure criteria. For example, if a program/erase error threshold on a flash device can be adjusted, the controller 70 may raise the threshold in the event of program/erase failure rather than declaring block failure. If program/erase failures persist after the threshold reaches a limit, the memory block may be determined as bad. Block failure criteria may be based on whether communication can be established with a memory die/plane. For example, if communication cannot be established with a memory die, or multiple memory dies (e.g., a package) then the communication failure may be treated as a memory die and/or multi-die failure (e.g., a chip enable physical failure may be a memory die failure if there is one memory die per chip enable).

A memory unit failure test may randomly select memory blocks from a memory die/plane. The number of blocks to be selected may be a pre-determined value (e.g., N). The N randomly selected memory blocks of the memory unit being tested may be checked to determine whether the memory blocks are bad. In one example embodiment when the memory unit failure test is implemented during the run-time of the drive 90, a consecutive number of bad memory blocks may need to be discovered before the memory die/plane is declared bad. Testing for a consecutive number of bad memory blocks may minimize test time.

When the memory unit failure test is performed during the run-time of the drive 90, different threshold values may be implemented for tracking bad memory blocks due to program/erase failure and bad memory blocks due to read failure. For example, if the consecutive number of bad memory blocks due to program/erase failure is greater than or equal to a program/erase error threshold (e.g., BlockPE-FailLimitA), the memory die/plane may be declared bad. In another example, if the consecutive number of bad memory blocks due to read failure is greater than or equal to a read error threshold (e.g., BlockRFailLimitA), the memory die/plane may be declared bad. The value of N may be the maximum value of the program/erase threshold and the read error threshold.

When the memory unit failure test is performed during the MST of the drive 90, different threshold values may be implemented for tracking bad memory blocks due to program/erase failure and bad memory blocks due to read failure. For example, if the total number of bad memory blocks due to program/erase failure is greater than or equal to a program/erase error threshold (e.g., BlockPEFailLimitMst), the memory die/plane may be declared bad. In another example, if the total number of bad memory blocks due to read failure is greater than or equal to a read error threshold (e.g., BlockRFailLimitMst), the memory die/plane may be declared bad. The two threshold values (e.g., Block-PEFailLimitMst and BlockRFailLimitMst) may be determined by known block failure rates and/or target false positive probability. The higher the threshold values, the lower the probability of detecting a good memory die/plane (e.g., a memory die/plane that is reliable) as bad.

Figure 5A:
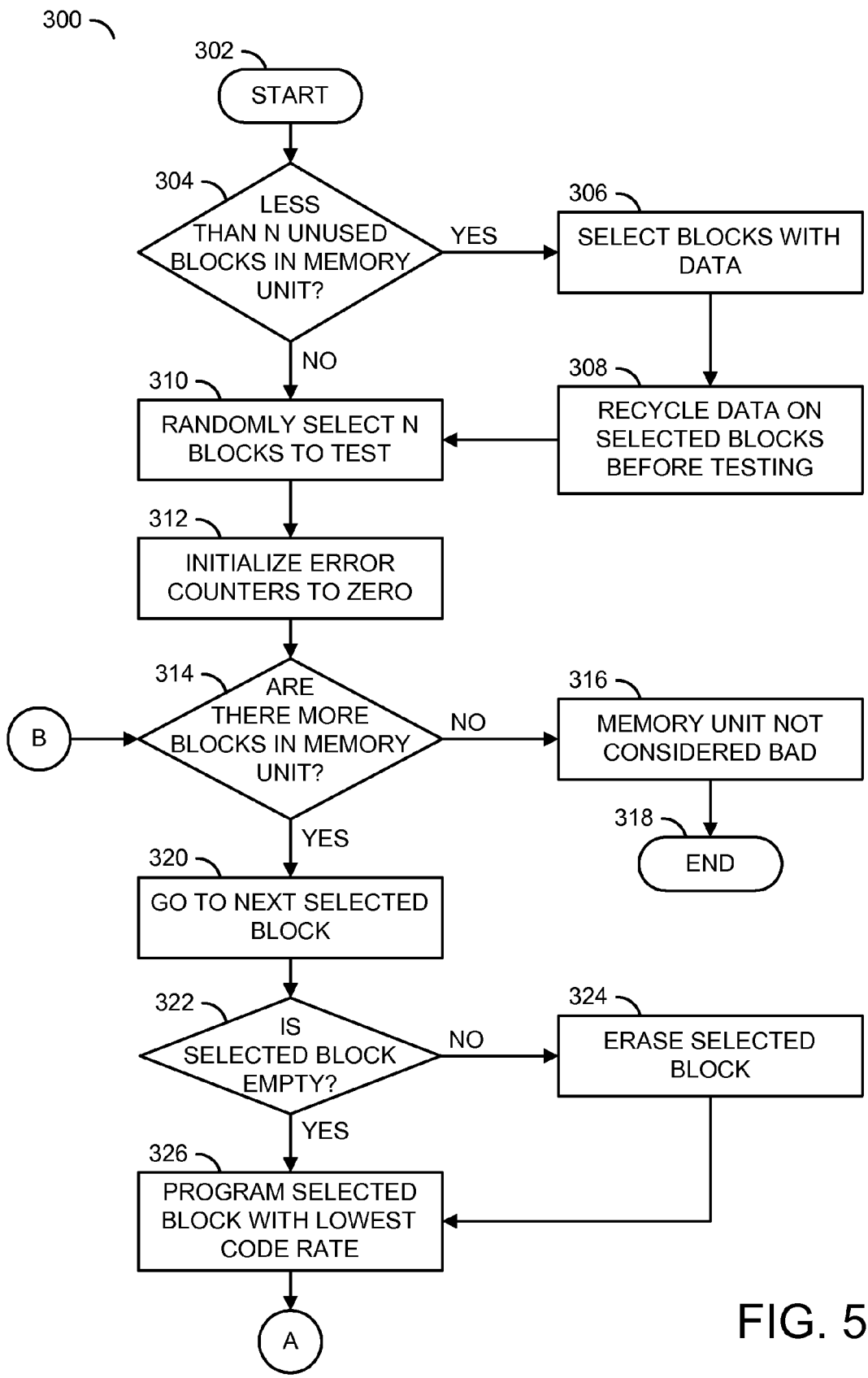
FIGS. 5A-5B show a flow diagram illustrating a memory unit failure test.
Figure 5B:
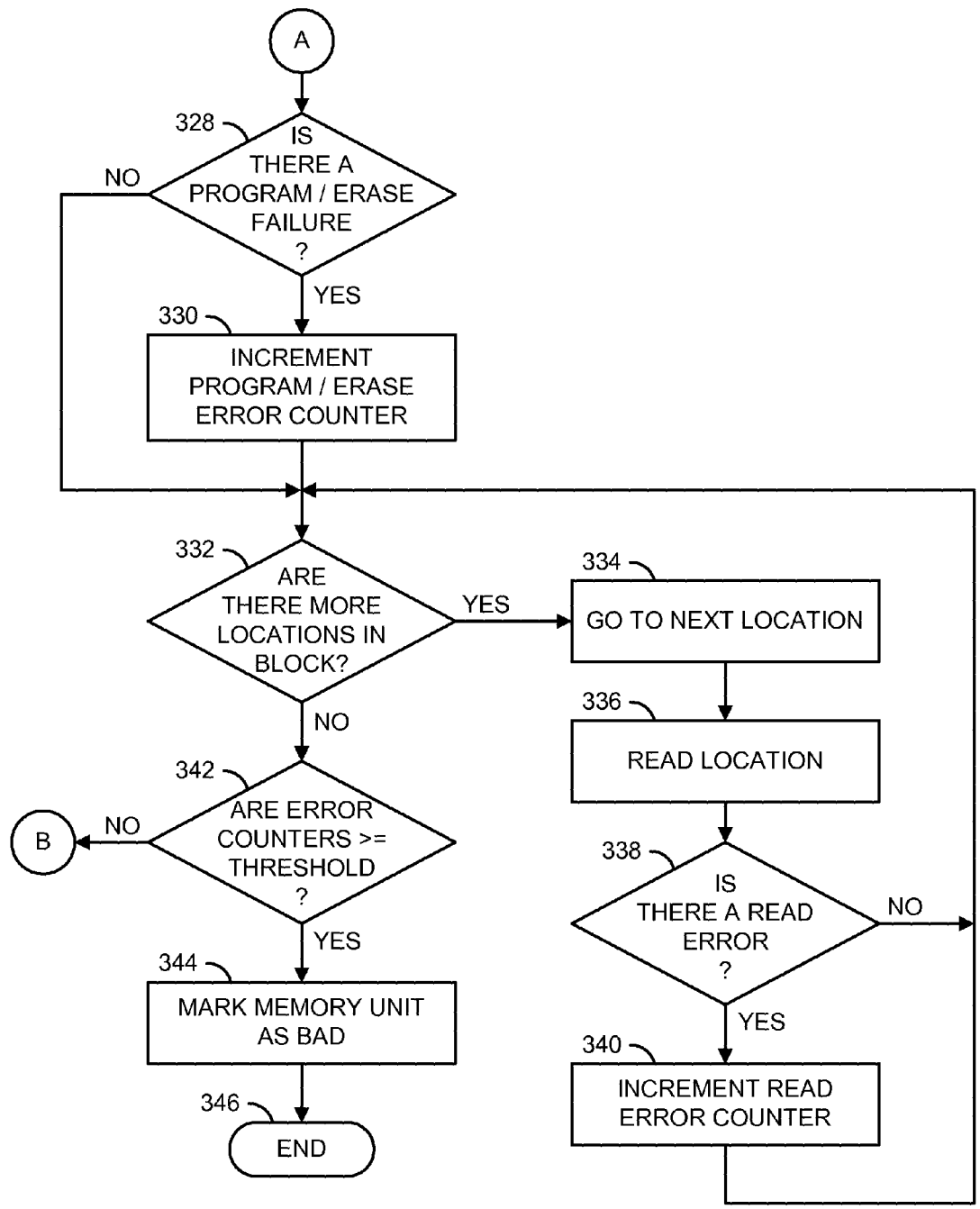

Referring to FIGS. 5A-5B, a flow diagram of a method (or process) 300 is shown. The method 300 may implement an example of a memory unit failure test. The method 300 generally comprises a step (or state) 302, a decision step (or state) 304, a step (or state) 306, a step (or state) 308, a step (or state) 310, a step (or state) 312, a decision step (or state) 314, a step (or state) 316, a step (or state) 318, a step (or state) 320, a decision step (or state) 322, a step (or state) 324, a step (or state) 326, a decision step (or state) 328, a step (or state) 330, a decision step (or state) 332, a step (or state) 334, a step (or state) 336, a decision step (or state) 338, a step (or state) 340, a decision step (or state) 342, a step (or state) 344, and a step (or state) 346. The state 302 may start the method 300. Next, the method 300 moves to the decision state 304.

If the decision state 304 determines there are less than N unused blocks in the memory unit, the method 300 moves to the state 306. If not, the method 300 moves to the state 310. The memory unit may be one of the memory dies 82a-82n and/or one of the memory planes 92a-92n. In the state 306 the SSD controller 70 selects blocks with data. Next, the method 300 moves to the state 308. In the state 308 the SSD controller 70 recycles data on the selected blocks before testing. For example, the data may be recycled/moved to a reliable location. Next, the method 300 moves to the state 310. In the state 310, N blocks are randomly selected to test. In the state 312, the error counters are initialized to zero. The controller 70 may track a separate counter for program/erase errors and read errors. Next, the method 300 moves to the decision state 314.

The decision state 314 determines if there are more blocks in the memory unit. If not, the method 300 moves to the state 316. In the state 316, the memory unit is not considered bad (e.g., the memory unit may be utilized by the controller 70). Next, the method 300 moves to the state 318, which ends the method 300. If the decision state 314 determines there are more blocks in the memory unit, the method 300 moves to the state 320. The state 320 goes to the next selected block. Next, the method 320 moves to the decision state 322. If the decision state 322 determines the selected block is not empty, the method 300 moves to the state 324. The state 324 erases the selected block. Next, the method 300 moves to the state 326. If the decision state 322 determines the selected block is empty, the method 300 moves to the state 326. The state 326 programs the selected blocks with the lowest code rate. Next, the method 300 moves to the decision state 328.

If the decision state 328 determines there is a program/erase failure, the method 300 moves to the state 330. If not, the method 300 moves to the decision state 332. The state 330 increments the program/erase error counter. Next, the method 300 moves to the decision state 332.

If the decision state 332 determines there are not more locations in the block, the method 300 moves to the decision state 342. A location in the block may be a nonvolatile memory location. If the decision state 332 determines there are more locations in the block, the method 300 moves to the state 334. The state 334 goes to the next location. Next, the state 336 reads the location. Next, the method 300 moves to the decision state 338. If the decision state 338 determines there is not a read error, the method 300 returns to the decision state 332. In the decision state 338, if there is a read error the method 300 moves to the state 340. The state 340 increments the read error counter. Next, the method 300 returns to the decision state 332.

If the decision state 342 determines the error counters are greater than or equal to a threshold value, the method 300 moves to the state 344. For example, when the method 300 is performed during the run-time of the drive 90, if the read error counter is greater than or equal to the read error threshold BlockRFailLimitA and/or the program/erase counter is greater than or equal to the program/erase error threshold BlockPEFailLimitA. In another example, when the method 300 is performed during the MST of the drive 90, if the read error counter is greater than or equal to the read error threshold BlockRFailLimitMst and/or the program/erase counter is greater than or equal to the program/erase error threshold BlockPEFailLimitMst. The state 344 marks the memory unit as bad. Next, the method 300 moves to the state 346, which ends the method 300. If the decision state 342 determines the error counters are not greater than or equal to the threshold value, the method 300 returns to the decision state 314.

The memory unit failure test method 300 may be performed during the life time of the SSD 90, and/or during a manufacturer self-test (MST). During the life time of the SSD 90 the memory unit failure test 300 may detect bad memory dies/planes on demand. During the MST the memory unit failure test 300 may be embedded in the MST procedures.

During the lifetime of the SSD 90, the memory unit failure test 300 may be triggered only when a bad memory block is detected (e.g., due to one the bad memory block criteria described in FIGS. 3-4). The memory unit failure test 300 may not have a pre-determined schedule. Generally, the controller 70 may have background tasks (e.g., wear leveling, garbage collection, data recycling, etc.) Generally, during the lifetime of the SSD 90 a bad memory die/plane may be triggered by operations by the host 60 and/or internal background operations.

The memory unit failure test 300 may be applied to a memory die and/or a memory plane. In another example, the memory unit failure test 300 may be applied to a memory package to determine if a die failure is caused by a physical connectivity issue. For example, if multiple memory dies sharing the same pins are all bad, there may be a physical connectivity issue. The memory unit failure test may select a pre-determined number N of the memory blocks 84a-84n in the same memory die/plane. If there are less than N empty blocks in the memory die/plane, the memory unit failure test 300 may select memory blocks that contain data. The data may be recycled before testing the memory blocks. For example, one or more memory blocks that contain data may be taken out of service temporarily to be tested, either in a serial or parallel fashion.

Generally, modern flash memory circuits (e.g., the memory circuit 80) implement multiple memory planes (e.g., the memory planes 92a-92n). The controller 70 may determine which of the memory planes 92a-92n are bad in a memory die that has been declared as bad. For example, the memory die 82a may be declared bad. However, each of the memory planes 92a-92n may not be bad. For example, the memory plane 92a in the memory die 82b may be bad. However, the memory plane 92b in the memory die 82b may not be bad. Each of the memory planes 92a-92n may account for a significant amount of memory capacity. To avoid retiring memory planes that are not bad, the controller 70 may employ both a memory die failure test and a memory plane failure test. For example, the memory unit failure test 300 may be performed on a memory die and then on each of the memory planes 92a-92n in the memory die.

Figure 6:
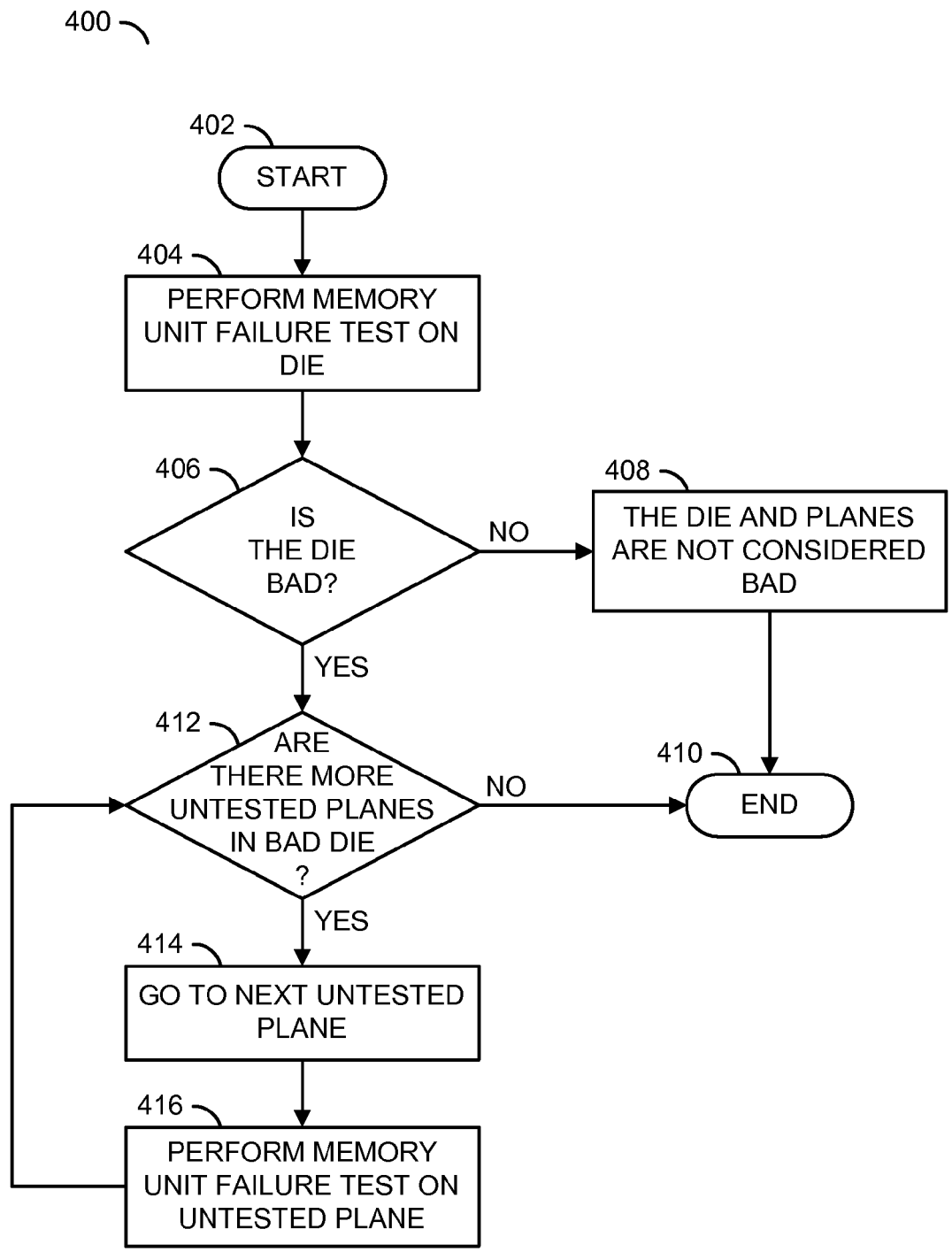
FIG. 6 is a flow diagram illustrating both a die failure test and a plane failure test.

Referring to FIG. 6, a flow diagram of a method (or process) 400 is shown. The method 400 may implement an example of both a die failure test and a plane failure test. The method 400 generally comprises a step (or state) 402, a step (or state) 404, a decision step (or state) 406, a step (or state) 408, a step (or state) 410, a decision step (or state) 412, a step (or state) 414, and a step (or state) 416. The state 402 may start the method 400. Next, the state 404 may perform the memory unit failure test on a memory die (e.g., the memory unit failure test as described in FIG. 5). Next, the method 400 may move to the decision state 406. If the decision state 406 determines the memory die is not bad, the method 400 moves to the state 408. In the state 408 the memory die and memory planes are not considered bad (e.g., not marked as bad on the bad memory unit list). Next, the method 400 moves to the state 410, which ends the method 400. If the decision state 406 determines the memory die is bad, the method 400 moves to the decision state 412.

If the decision state 412 determines there are not more untested planes in the bad memory die, the method 400 moves to the state 410, which ends the method 400. If the decision state 412 determines there are more untested planes in the bad memory die, the method 400 moves to the state 414. The state 414 goes to the next untested memory plane. Next, the state 416 performs the memory unit failure test on the untested plane (e.g., the memory unit failure test as described in FIG. 5). Next, the method 400 returns to the decision state 412.

Performing the memory unit failure test 300 during manufacturing time may detect bad memory units before the drive 90 has been shipped and/or used by a consumer. For example, an initial list of bad memory dies/planes may be implemented so the controller 70 may avoid writing user data to the bad memory dies/planes in the first place. The memory unit failure test 300 may be embedded in the MST. Bad memory die/plane detection during the MST may follow similar criteria as the run-time memory unit failure test 300. During the MST the controller 70 may not need to rely on consecutive memory block failures. During the MST, the controller 70 may count the total number of block failures within a memory die/plane. The MST performs a full drive scan, including erase, program, and read operations. Embedding the memory unit failure test 300 to check the total number of block failures may not significantly impact the time needed to perform the MST. The MST may perform multiple scans (e.g., erase, program, and read operations to detect errors on memory blocks).

A bad block may be considered a memory block that is not considered usable to store data and/or that should be retired. For example, a bad block may be a defective memory block and/or a memory block that has failed. In one example, a bad block may be on the verge of failure and pro-actively marked bad. For example, a memory block may be considered bad when the memory block does not meet a certain performance and/or reliability threshold. The SSD controller 70 may test the memory blocks 84a-84n to determine if each of the memory blocks 84a-84n meets such a performance and/or reliability threshold. In one example, bad block detection may be conservative (e.g., the memory block may be retired long before failure). In another example, bad block detection may be aggressive (e.g., the memory block operating very close to specifications may continue to be used in an effort to maximize usable space on the drive 90). The particular criteria to determine whether a block should be marked as bad may be varied to meet the design criteria of a particular implementation. If a memory block is marked bad before failure, the data on the marked memory block may be moved to another location to prevent data loss. The SSD controller 70 may ignore (e.g., not use) the blocks marked bad when processing I/O requests. Ignoring bad blocks may improve the performance and/or reliability of the memory circuit 80.

The functions performed by the diagrams of FIGS. 3-6 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   a memory configured to store data, the memory comprising a plurality of dies each (i) having a size less than a total size of the memory and (ii) comprising a plurality of planes, each of the planes comprising a plurality of blocks; and
   a controller configured to (i) process a plurality of input/output requests to/from the memory, (ii) determine which of the blocks are bad in each of the dies and planes, and (iii) determine whether to mark one or more of the dies as bad in response to a first test and whether to mark one or more planes within one of the dies as bad in response to a second test, wherein (a) the first test is configured to analyze the bad blocks in each of the dies, (b) if one of the dies fails the first test, the controller is configured to perform the second test on each of the planes of the die that failed the first test, (c) the second test is configured to analyze the bad blocks in each of the planes of the die that failed the first test, (d) the first test is based on determining whether a number of bad blocks in one of the dies exceeds a threshold number of bad blocks, (e) the second test is based on determining whether a number of bad blocks in one of the planes exceeds a threshold number of bad blocks and (f) the dies that fail the first test are not marked as bad if one or more planes in the dies that fail the first test do not fail the second test.

2. The apparatus according to claim 1, wherein each of the plurality of dies and the plurality of planes are memory units of the memory.

3. The apparatus according to claim 2, wherein the first test and the second test are performed (A) during a lifetime of the apparatus in a first mode, and (B) during a manufacturer self-test in a second mode.

4. The apparatus according to claim 3, wherein the first test and the second test performed during the lifetime of the apparatus are performed on demand.

5. The apparatus according to claim 3, wherein the threshold number of bad blocks of the first test and the second test performed during the lifetime of the apparatus is compared to a consecutive number of the bad blocks in the memory unit.

6. The apparatus according to claim 3, wherein the first test and the second test performed during the manufacturer self-test are embedded in procedures of the manufacturer self-test.

7. The apparatus according to claim 3, wherein the threshold number of bad blocks of the first test and the second test performed during the manufacturer self-test is compared to a total number of the bad blocks in the memory unit.

8. The apparatus according to claim 2, wherein the threshold number of bad blocks of the first test and the second test is compared to a number of the blocks in the memory unit having program/erase errors in a first mode and read errors in a second mode.

9. The apparatus according to claim 1, wherein the first test and the second test track errors in the blocks of the memory.

10. The apparatus according to claim 9, wherein the tracked errors are program/erase errors in a first mode and read errors in a second mode.

11. The apparatus according to claim 10, wherein the program/erase errors are tracked separately from the read errors.

12. The apparatus according to claim 2, wherein the controller is further configured to pro-actively respond to the memory units marked as bad.

13. The apparatus according to claim 1, wherein the threshold number of bad blocks of the first test and the second test is adjustable.

14. The apparatus according to claim 1, wherein the controller is further configured to implement an error recovery correction capability for a memory page and a memory block.

15. The apparatus according to claim 2, wherein the first test and the second test check a number of iterations to converge and a number of bit errors of the blocks of the memory unit.

16. The apparatus according to claim 2, wherein the first test and the second test check if communication can be established with the memory unit.

17. The apparatus according to claim 1, wherein the memory and the controller form a solid-state drive.

18. The apparatus according to claim 2, wherein controller is further configured to (a) retire the memory units marked as bad and (b) avoid bad block handling for the blocks in the memory units marked as bad.

19. An apparatus comprising:
an interface configured to process a plurality of read/write operations to/from a memory, the memory comprising a plurality of dies each (i) having a size less than a total size of the memory and (ii) comprising a plurality of planes, each of the planes comprising a plurality of blocks; and
a control circuit configured to (i) determine which of the blocks are bad in each of the dies and planes, and (ii) determine whether to mark one or more of the dies as bad in response to a first test and whether to mark one or more planes within one of the dies as bad in response to a second test wherein (a) the first test is configured to analyze the bad blocks in each of the dies, (b) if one of the dies fails the first test, the control circuit is configured to perform the second test on each of the planes of the die that failed the first test, (c) the second test is configured to analyze the bad blocks in each of the planes of the die that failed the first test, (d) the first test is based on determining whether a number of bad blocks in the dies exceeds a threshold number of the bad blocks, (e) the second test is based on determining whether a number of bad blocks in one of the planes exceeds a threshold number of bad blocks and (f) the dies that fail the first test are not marked as bad if one or more planes in the dies that fail the first test do not fail the second test.

20. A method for detecting bad dies and planes in a solid-state drive (SSD), comprising the steps of:
processing a plurality of read/write operations to/from a memory, the memory comprising a plurality of dies and planes each (i) having a size less than a total size of the memory and (ii) comprising a plurality of planes, each of the planes comprising a plurality of blocks;
determining which of the blocks are bad in each of the dies and planes; and
determining whether to mark one or more of the dies as bad in response to a first test and whether to mark one or more planes within one of the dies as bad in response to a second test, wherein (a) the first test is configured to analyze the bad blocks in each of the dies, (b) the second test is performed on each of the planes of the die that failed the first test, if one of the dies fails the first test, (c) the second test is configured to analyze the bad blocks in each of the planes of the die that failed the first test, (d) the first test is based on determining whether a number of bad blocks in the dies exceeds a threshold number of the bad blocks, (e) the second test is based on determining whether a number of bad blocks in one of the planes exceeds a threshold number of bad blocks and (f) the dies that fail the first test are not marked as bad if one or more planes in the dies that fail the first test do not fail the second test.

* * * * *